(12) United States Patent
Pellizzer et al.

(10) Patent No.: US 8,293,598 B2
(45) Date of Patent: Oct. 23, 2012

(54) PROCESS FOR MANUFACTURING A MEMORY DEVICE INCLUDING A VERTICAL BIPOLAR JUNCTION TRANSISTOR AND A CMOS TRANSISTOR WITH SPACERS

(75) Inventors: Fabio Pellizzer, Cornate D'Adda (IT); Cristina Casellato, Vercelli (IT); Michele Magistretti, Gessate (IT); Roberto Colombo, Lentate sul Seveso (IT); Lucilla Brattico, Ornago (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 633 days.

(21) Appl. No.: 12/557,396

(22) Filed: Sep. 10, 2009

(65) Prior Publication Data

US 2010/0059829 A1    Mar. 11, 2010

(30) Foreign Application Priority Data

Sep. 10, 2008   (IT) .............................. TO2008A0667

(51) Int. Cl.
*H01L 21/8238* (2006.01)
*H01L 27/06* (2006.01)
(52) U.S. Cl. ............... 438/202; 257/370; 257/E21.696; 257/E27.015
(58) Field of Classification Search .............. 438/202; 257/370, E21.696, E27.015
See application file for complete search history.

(56) References Cited

U.S. PATENT DOCUMENTS

| 6,717,193 | B2* | 4/2004 | Olewine et al. ............... 257/295 |
| 7,227,171 | B2 | 6/2007 | Bez et al. |
| 8,129,234 | B2* | 3/2012 | Wallner et al. ............... 438/204 |
| 2004/0097031 | A1 | 5/2004 | Lee et al. |
| 2005/0142779 | A1 | 6/2005 | Cheong et al. |
| 2007/0051936 | A1 | 3/2007 | Pellizzer et al. |
| 2007/0161176 | A1* | 7/2007 | Dahl et al. ................... 438/230 |
| 2007/0254446 | A1 | 11/2007 | Pellizzer et al. |
| 2008/0116493 | A1* | 5/2008 | Adkisson et al. ............. 257/288 |

FOREIGN PATENT DOCUMENTS

| EP | 1 408 550 B1 | 12/2006 |
| JP | 2002-198437 A | 7/2002 |

* cited by examiner

*Primary Examiner* — Lex Malsawma
(74) *Attorney, Agent, or Firm* — Seed IP Law Group PLLC (57) ABSTRACT

A bipolar selection transistor and a circuitry MOS transistor for a memory device are formed in a semiconductor body. The bipolar selection transistor is formed by implanting a buried collector, implanting a base region on the buried collector, forming a silicide protection mask on the semiconductor body, and implanting an emitter region and a control contact region. The circuitry MOS transistor is formed by defining a gate on the semiconductor body, forming lateral spacers on the sides of the gate and implanting source and drain regions on the sides of the lateral spacers. Then, a silicide region is formed on the emitter, base contact, source and drain regions and the gate, in a self-aligned way. The lateral spacers are multilayer structures including at least two different layers, one of which is used to form the silicide protection mask on the bipolar selection transistor. Thereby, the dimensions of the lateral spacers are decoupled from the thickness of the silicide protection mask.

20 Claims, 7 Drawing Sheets

PROCESS FOR MANUFACTURING A MEMORY DEVICE INCLUDING A VERTICAL BIPOLAR JUNCTION TRANSISTOR AND A CMOS TRANSISTOR WITH SPACERS

BACKGROUND

1. Technical Field

The present disclosure relates to a process for manufacturing a memory device including a vertical bipolar junction transistor and a MOS transistor with spacers. In particular, the disclosure refers to the manufacture of circuitry transistors and an array of selectors in a phase change memory (PCM) device, without being limited thereto.

2. Description of the Related Art

As is known, phase change memories are formed by memory cells connected at the intersections of bitlines and wordlines and comprising each a memory element and a selection element. A memory element comprises a phase change region made of a phase change material, i.e., a material that may be electrically switched between a generally amorphous and a generally crystalline state across the entire spectrum between completely amorphous and completely crystalline states.

Typical materials suitable for the phase change region of the memory elements include various chalcogenide elements. The state of the phase change materials is non-volatile, absent application of excess temperatures, such as those in excess of 150° C., for extended times. When the memory is set in either a crystalline, semicrystalline, amorphous, or semiamorphous state representing a resistance value, that value is retained until reprogrammed, even if power is removed.

Selection elements may be formed according to different technologies, for example they can be implemented by diodes, by MOS transistors or bipolar transistors.

U.S. Pat. No. 7,227,171 discloses a method for manufacturing memory devices including circuitry MOS transistors and array selection transistors. In detail, the circuitry MOS transistors are formed by growing an oxide layer onto the entire surface of the substrate; and deposing a polysilicon layer on the oxide layer. The polysilicon layer is then defined, to form gate regions of the periphery transistors; the polysilicon layer is completely removed from the array area. Then, LDD implants are carried out for the transistors; a salicide protection mask is formed to completely cover the array portion; a dielectric material (oxide) is deposed onto the whole wafer and etched, to form spacers on the sides of the gate regions of the circuitry MOS transistors; source and drain regions for the circuitry MOS transistors are implanted and salicide regions are grown over the gate regions and the source and drain regions in the circuitry area.

Then, after removing the salicide protection mask, collector regions and base regions of the selection bipolar transistors are implanted in the array area; the substrate is covered by a dielectric layer; the dielectric layer is etched to form contact; emitter and base contact regions are implanted in the substrate through the contact; conductive contact regions are formed in the contact; then phase change memory elements are formed above the selection bipolar transistors.

In order to simplify the etching of the contact and make such etching controllable to the same extent in all regions of the memory device, as well as to reduce the contact resistance of the junctions of the selection bipolar transistors, it has been already proposed to form salicided junctions also in the array area (see US Patent Application Publication No. 2007/0254446). To this end, after formation of the gate and the LDD regions of the circuitry MOS transistors a dielectric layer is deposited and etched to form spacers in the circuitry area and a silicide protection mask in the array area, covering selective portions of the array area. Then using suitable mask in addition to the silicide protection mask, emitters and base contacts of the selection bipolar transistors as well as source and drain regions of the MOS transistors are implanted.

However, the formation of the dielectric spacers in the circuitry area and of the silicide protection mask in the array area has proved troublesome. In fact, the lateral width of the dielectric spacers is strictly dependent on the thickness of the dielectric layer. As a consequence, the spacer width and the silicide protection mask thickness are dependent on one another; however, they are subjected to conflicting requirements. In fact, if the thickness of the dielectric layer is selected so as to obtain a desired length of the dielectric spacers, such a thickness is excessive for the silicide protection mask that cannot be defined without damaging the already defined structures in the circuitry area. On the other hand, if the thickness is selected according to the requirements of the silicide protection mask, the spacers would be too narrow, and such as not to ensure the correct geometrical characteristics needed for the circuitry MOS transistors. Therefore, a compromise solution has to be used, which however does not ensure optimal conditions in any of the circuitry or the array area.

BRIEF SUMMARY

One embodiment is a process for decoupling the lateral thickness or length of the dielectric spacers of the circuitry MOS transistors from the thickness of the silicide protection mask used in the circuitry area.

One embodiment is a process that manufactures a memory device having a vertical bipolar junction transistor and a CMOS transistor in a semiconductor body having a surface. The process includes:

forming field insulation regions of dielectric material in the semiconductor body, the field insulating regions delimiting an array portion and a first circuitry portion, insulated from each other;

forming a bipolar transistor in the array portion, including forming a buried first conduction region buried at a distance from the surface, forming a control region on the first conduction region, forming a second conduction region within the control region, and forming a control contact region within the control region and spaced apart from the second conduction region; and forming a first MOS transistor in the circuitry portion, including forming a first gate structure on the surface, forming first light doped regions in the body, laterally to the first gate structure, forming first lateral spacers on sides of the first gate structure, and forming third conduction regions in the body, laterally to the first lateral spacers.

Forming the first lateral spacers includes, after forming the first gate structure and before forming the second conduction region and the control contact region, the steps of:

forming lower spacer portions on the sides of the first gate structure and forming an dielectric portion on the array portion; and forming upper spacer portions on top of and on the sides of the lower spacer portions, the lower spacer portions and upper spacer portions defining a multilayer structure.

Forming the bipolar transistor includes forming a protection mask by etching the dielectric portion on the array portion after forming the upper and lower spacer portions.

Forming the second conduction region includes selectively implanting first conductivity-type dopants through a first opening in the protection mask after forming the upper and lower spacer portions.

Forming the control contact region includes selectively implanting second conductivity-type doping agents through a second opening in the protection mask after forming the upper and lower spacer portions.

BRIEF DESCRIPTION OF THE SEVERAL VIEWS OF THE DRAWINGS

For the understanding of the present disclosure, preferred embodiments thereof are now described, purely as non-limitative examples, with reference to the enclosed drawings, wherein.

DETAILED DESCRIPTION

The following description relates to the manufacture of a low-voltage transistor and a high-voltage transistor in the circuitry area, as well as of a selection bipolar transistor in the array area. However, the disclosure encompasses also the manufacture of MOS transistors of different voltage level, e.g., only low-voltage transistors or high-voltage transistors.

Figure 1:
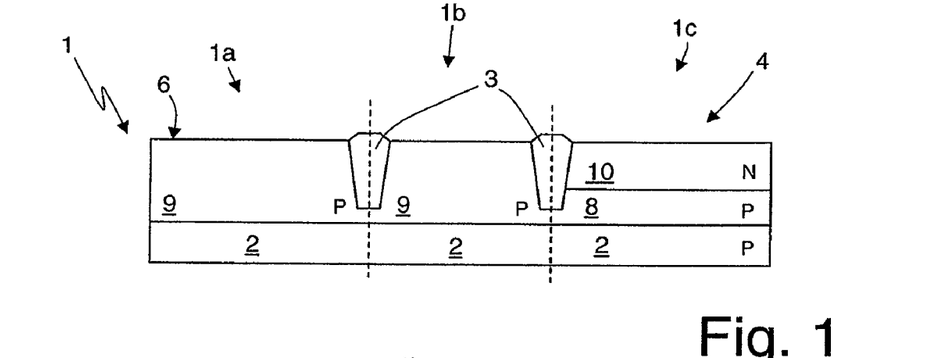
FIGS. 1-12 show cross-sections of a portion of a semiconductor body in subsequent manufacturing steps of the present process.

In particular, FIG. 1 shows a wafer 1 of monocrystalline semiconductor material comprising a substrate 2 of a first conductivity type (here P-type), having a wafer surface 6. In detail, in FIG. 1, the left-hand portion of the wafer 1 forms a low voltage (LV) circuitry portion 1a, the central portion of the wafer 1 forms a high voltage (HV) circuitry portion 1b and the right-hand portion of the wafer 1 forms an array portion 1c.

The wafer 1 in FIG. 1 has already been processed with standard frontend steps, including, as also disclosed in U.S. Pat. No. 7,227,171, defining active areas 4 e.g., using a "shallow trench" technology; defining buried collector regions 8, by introducing doping elements of the first conductivity type in the array portion 1c; defining wells 9, by introducing doping elements of the first conductivity type in the LV portion 1a and in the HV portion 1b; defining base regions 10, by introducing doping elements of a second conductivity type (here N-type) above the buried collector regions 8, in the array portion 1c.

Thus, according to FIG. 1, field oxide regions 3 insulate from each other the LV portion 1a, the HV portion 1b and the array portion 1c.

Figure 2:
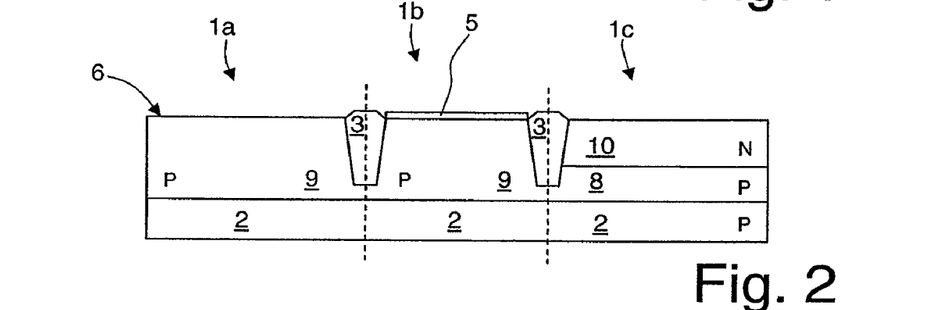
Figure 3:
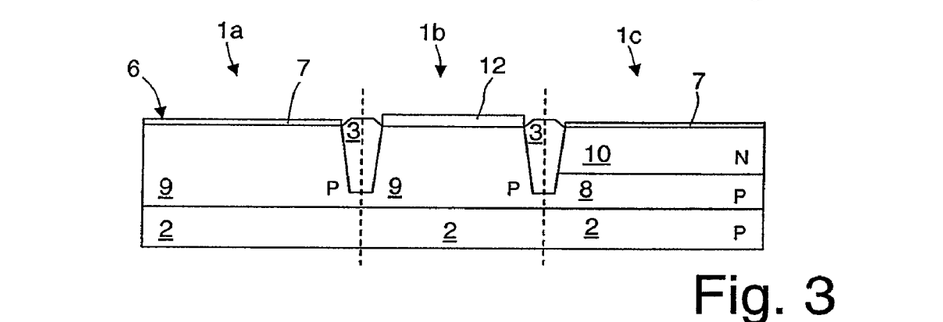

Then, according to FIGS. 2-3, a first oxide layer 5 is grown on the wafer surface 6 and completely etched away in the LV circuitry portion 1a and in the array portion 1c by using a masking resist (not shown); successively, a second oxide layer 7 is grown on the wafer surface 6, thus obtaining a thin oxide layer 7 on the LV circuitry portion 1a and on the array portion 1c, and increasing the thickness of the first oxide layer 5 (hereinafter indicated as thick oxide layer 12) in the HV circuitry portion 1b.

Figure 4:
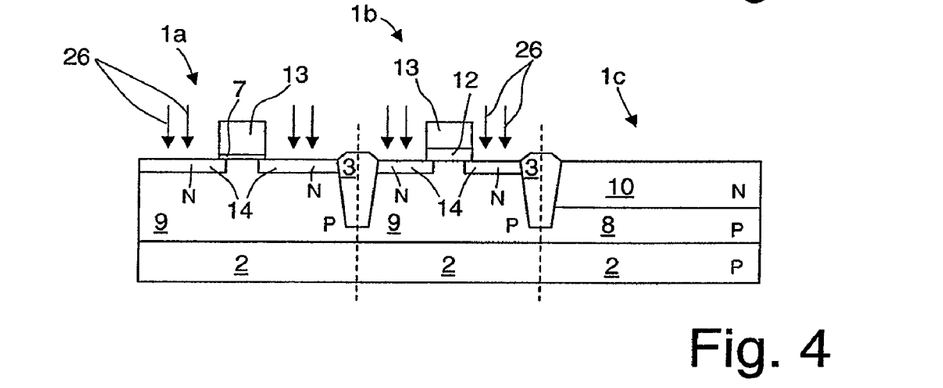

Thereafter, FIG. 4, a polysilicon layer is deposited on the wafer 1; the polysilicon layer and the underlying thin and thick oxide layer 7 and 12 are maskedly etched so to define polysilicon gates 13 above oxide regions 7 and 12 in the LV and HV circuitry portions 1a and 1b. Then, LDD implants, shown by arrows 26 in FIG. 4, are carried out for both P-channel (not shown) and N-channel circuitry transistors in the LV and HV circuitry portions 1a and 1b, to form P-type lightly doped regions (not shown) and N-type lightly doped regions 14. During the implantation of LDD regions 14, in a per se known manner, the array portion 1c and the areas of the circuitry portions 1a and 1b not intended to be implanted are covered by a suitable mask, not shown.

Figure 5:
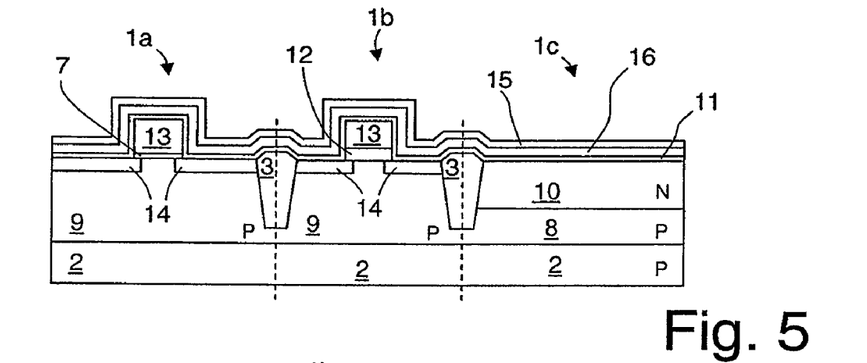
Figure 6:
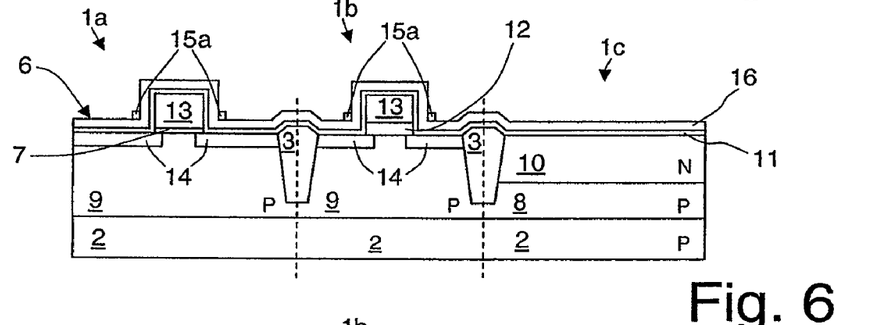
Figure 7:
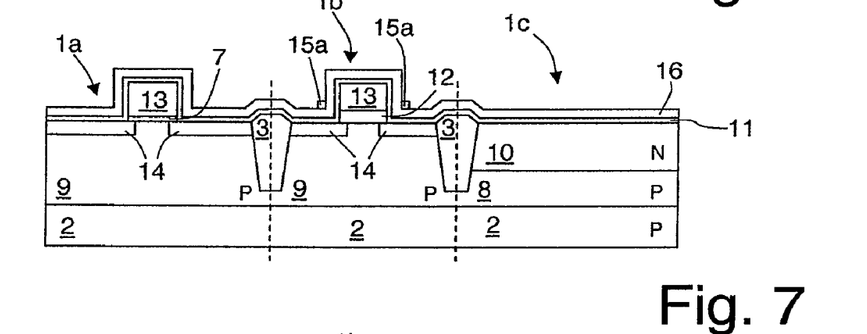

Then, FIG. 5, a dielectric multilayer material is deposited onto the wafer 1; in the embodiment, the dielectric multilayer material comprises a lower oxide layer 11 having, e.g., a thickness comprises between 5 nm and 25 nm, preferably of 16 nm, a nitride layer 16 having, e.g., a thickness comprises between 20 nm and 120 nm, preferably of 60 nm and an upper oxide layer 15 having, e.g., a thickness comprises between 10 nm and 80 nm, preferably of 50 nm. Thereafter, FIG. 6, a blanket oxide etch, preferably a dry anisotropic etch, is carried out so to remove most of the upper oxide layer 15. Since the etching procedure is preferably anisotropic and the etchants act along a preferential direction which is perpendicular to the wafer surface 6, the dielectric material 15 is removed everywhere except along sides of the gate regions 13 in the LV and HV circuitry portions 1a and 1b, leaving oxide spacer portions 15a. The horizontal and vertical extensions of the oxide spacer portions 15a depend on, respectively, the deposition thickness of the dielectric material 15 and on the etching parameters (time, rate, etc.). Successive masking and etching steps are carried out so to selectively remove, preferably by a wet isotropic etch, the oxide spacer portions 15a except in the HV circuitry portion 1b, FIG. 7.

Figure 8:
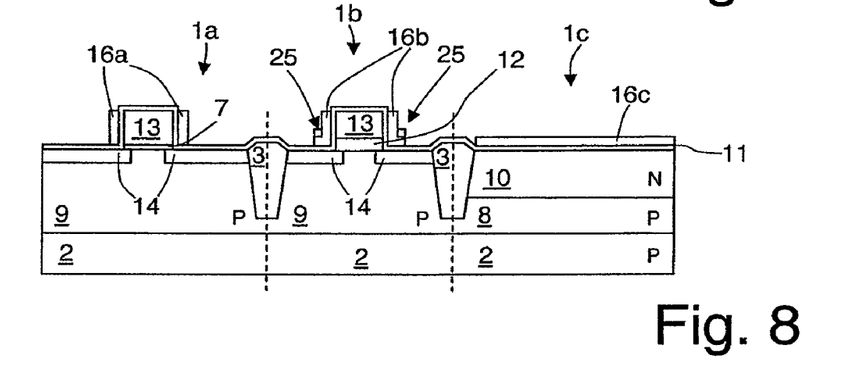

The nitride layer 16, FIG. 8, is afterwards etched using a mask (not shown) covering only the array portion 1c, preferably by dry anisotropic etching; thereby the nitride layer 16 is removed where it is exposed in the LV and HV circuitry portion 1a and 1b, and remains unaltered in the array portion 1c. In particular, at the end of the etching and in the LV circuitry portion 1a, the remaining nitride layer 16 forms LV spacers 16a on the two sides of each LV transistor gate; in the HV circuitry portion 1b the same process leads to the definition of L-shaped nitride portions 16b on both sides of each HV transistor gate 13, since the first HV spacer portions act as an added mask during the selective etching procedure. This results in the formation of multilayer spacers 25 which are formed by the oxide spacer portions 15a and L-shaped nitride portions 16b and are wider than the LV spacers 16a in the LV circuitry portion 1a. In the array portion 1c, the remaining nitride layer 16 is indicated hereinafter as undefined nitride portion 16c.

Figure 9:
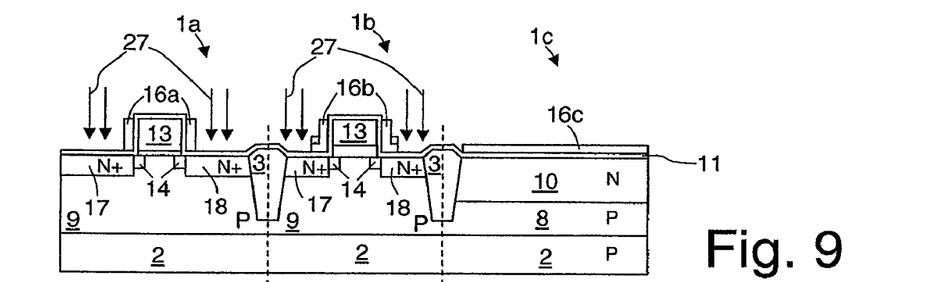

Then, FIG. 9, source and drain regions for the HV and LV circuitry transistors in the circuitry portions 1a and 1b are formed by introducing doping elements (in the portion shown in the drawings, N-type doping agents) as shown by arrows 27. After an activation/diffusion step performed in, for example, RTP (Rapid Thermal Process) chamber at a temperature comprised between 900 and 1000° C., highly doped source and drain regions 17 and 18, here of $N^+$-type, are formed in the LV and HV circuitry portion 1a and 1b.

Thereby, LV transistors 33a and high voltage transistors 33b are formed, respectively in the LV and HV circuitry portion 1a and 1b.

Figure 10:
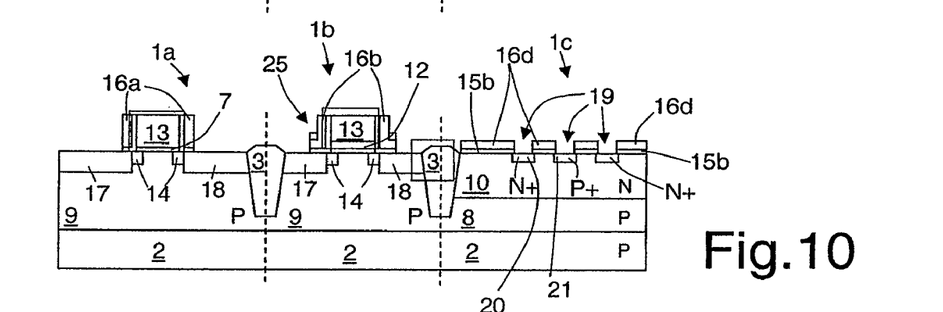

Thereafter, FIG. 10, using a resist mask not shown, the undefined nitride portion 16c and the dielectric layer 15b covering the array portion 1c of the wafer 1 are defined to form a silicon protection mask 16d which has openings 19 uncovering the base regions 10 where base contacts and emitter regions are to be formed. Using two masks (not shown) base contact regions 20, here of N$^+$ type; and, emitter regions 21, here of P$^+$ type, are implanted. The order to the base contact and emitter formation is not important, and can be reversed.

Figure 11:
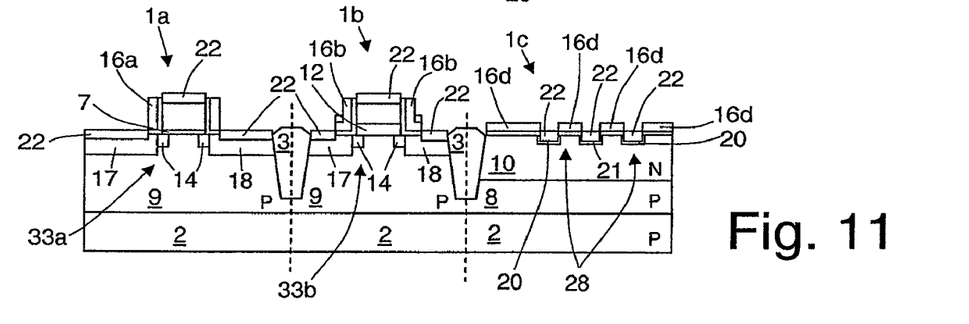

To reduce resistivity, FIG. 11, silicide regions 22 are then formed on the emitter regions 21 and base contacts 20 in the array portion 1c, and on the polysilicon gates 13, on the source and drain regions 17 and 18 of the circuitry transistors in the LV circuitry portion 1a and high voltage circuitry portion 1b.

Thereby, each emitter region 21 forms, together with the respective base region 10, the common collector region 8, the base contact 20 and the respective silicide regions 22, a selection bipolar junction transistor 28 of PNP type.

Figure 12:
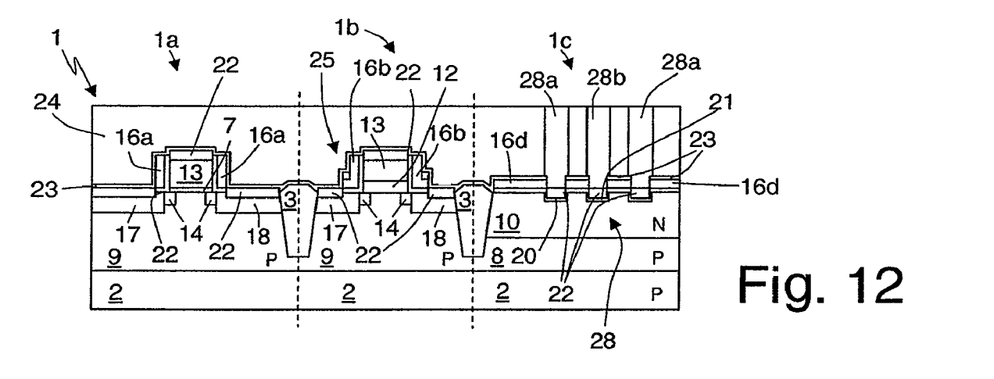

Then, FIG. 12, a first dielectric layer 23 (e.g., of nitride with a thickness of 20 nm) and a second dielectric layer 24 (e.g., of USG—Undoped Silicate Glass—with a thickness of 700 nm) are deposited (e.g., by plasma-enhanced magnetron-sputtering deposition) and then the surface is planarized (e.g., by chemical-mechanical polishing—CMP). Thereafter, the first dielectric layer 24 and the first nitride layer 23 are etched where contacts are to be made so as to form openings that reach the suicide regions 22 both in the circuitry portions 1a, 1b and in the array portion 1c. The openings are filled by a barrier layer, e.g., a multiple Ti/TiN layer, and by a tungsten layer, in a per se known manner, and the deposited layers are planarized to form first-level plugs 28a-28b for base contact regions and emitter regions of the selection bipolar transistors and first-level plugs circuitry for the MOS transistor (not shown).

Figure 13:
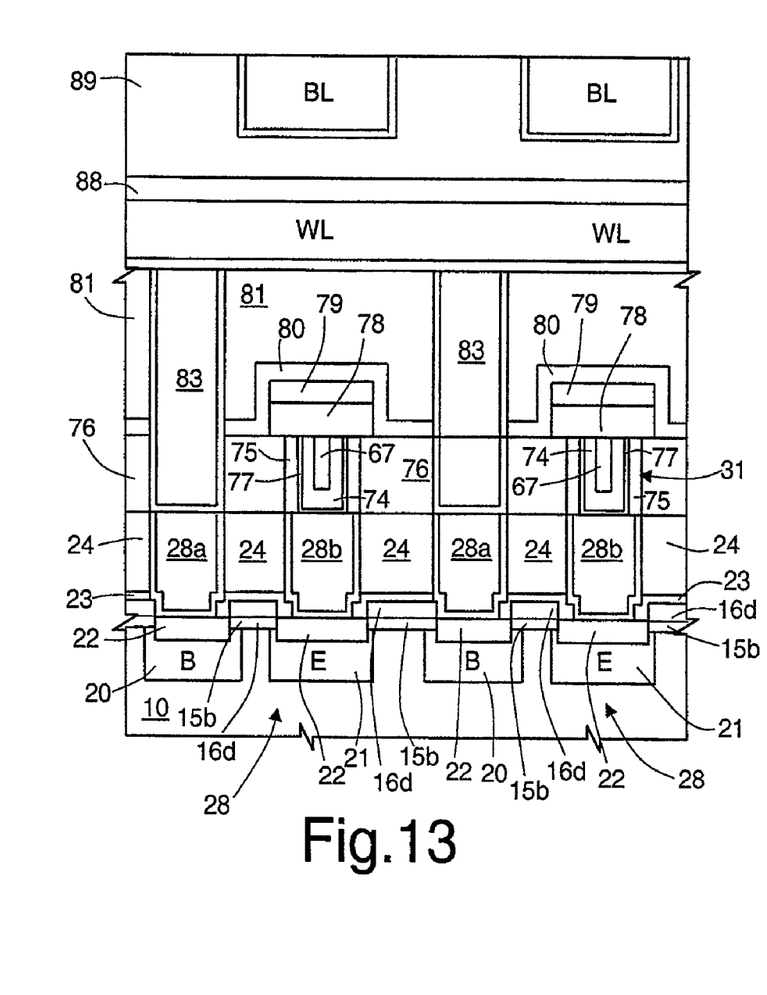
FIG. 13 shows an enlarged cross-section of the array portion of the final device of FIGS. 1-12, taken along line XIII-XIII of FIG. 15.
Figure 14:
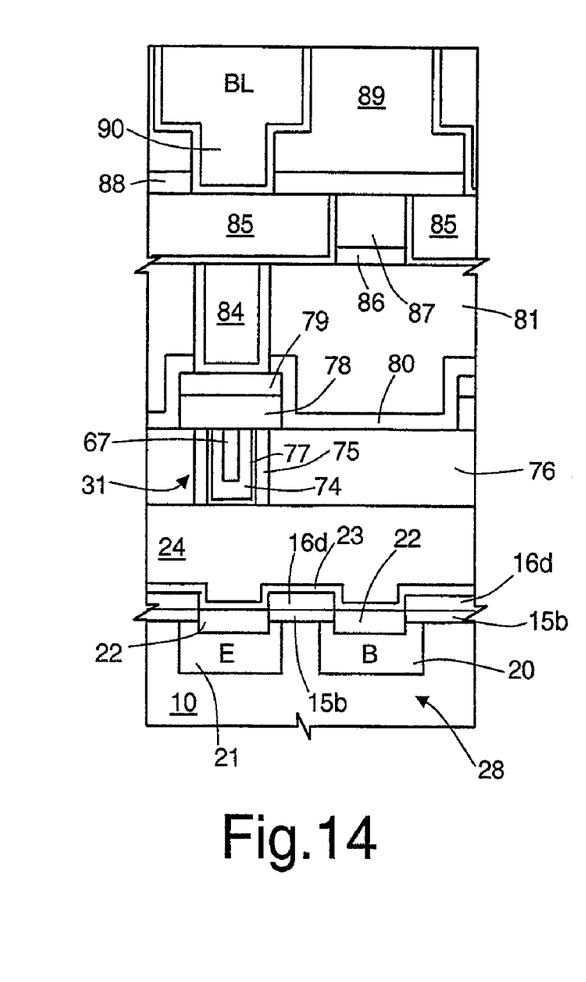
FIG. 14 shows another cross-section of the array portion of the final device taken along line XIV-XIV of FIG. 15.
Figure 15:
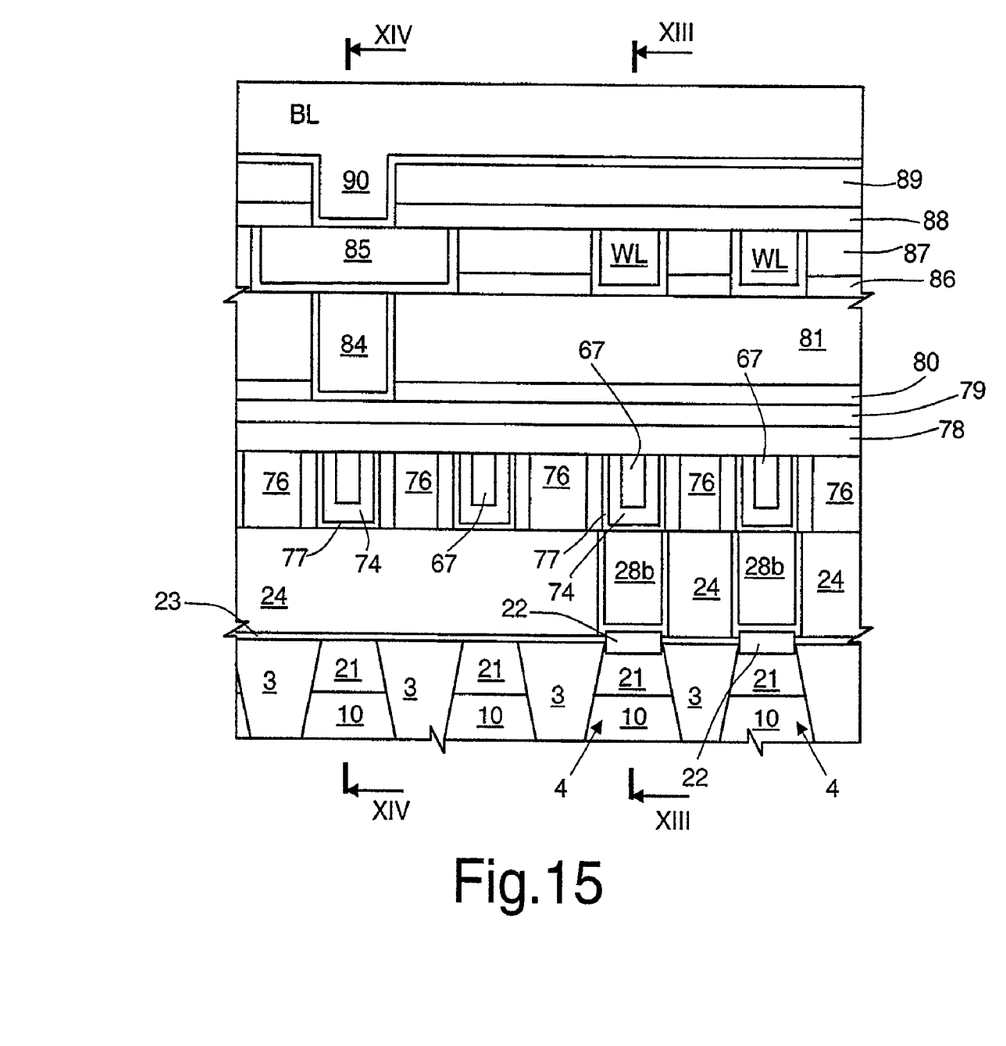
FIG. 15 shows a cross-section taken along the direction of the bitlines of the memory device.

Finally, the steps are carried out to form the memory elements. For example, the process described in U.S. Pat. No. 7,439,536 may be used to obtain the final structure of FIGS. 13-15, which show the architecture of the array portion 1c, wherein FIG. 13 is taken in the direction of the wordlines, FIG. 14 is taken along a plane parallel to the section plane of FIG. 13 and shows the portion of the memory device where strapping of the bit lines occurs and FIG. 15 is taken in the direction of the bitlines. In particular, FIG. 15 shows a plurality of active areas 4 isolated from each other by field oxide regions 3. Here a plurality of bipolar transistors 28 are formed in each active area 4 and each transistor 28 comprises an own emitter region 21 and an own base contact 20.

In detail, a second dielectric layer 76 is deposited; openings are formed in the second dielectric layer 76 above the emitter regions 64; a spacer layer 75 of silicon nitride is formed on the walls of the openings 31; a heater layer 77 and a sheath layer 74 are subsequently deposited to cover the walls and the bottom of the openings; a third dielectric layer 67 is deposited to fill the openings; and the wafer is planarized. Accordingly, the heaters 77 are generally cup-shaped. In FIG. 13, the heaters 77 extend on a first-level plug 28b which is in electrical contact with an emitter region 21, while in the plane of FIG. 14, no first-level plugs 28b extends below the heater 77. Next, a chalcogenic layer 78 of GST (Ge2Sb2Te5), and a metal layer 79 are deposited and defined to form resistive bit lines, which run perpendicularly to the plane of the sheet. Metal lines 79 thus create a first metal level.

Then, a sealing layer 80 and a fourth dielectric layer 81 are deposited; holes are opened, coated with a barrier layer and filled by a metal layer 83 or 84, of Cu.

Thus, the cross-section of FIG. 13 shows second-level, base plugs 83 which extend through the layers 76, 80 and 81 to contact the first-level plug 28a; the portion of FIGS. 14 and 15 show second-level, intermediate plugs 84 extending through the layers 80 and 81 to contact the first metal layer 79.

Then, wordlines WL, from a second metal layer, are formed on the fourth dielectric layer 81 in electrical contact with the second-level, base plugs 83 and thus the base regions 10, through the first-level plugs 28a and the base contact regions 20, as shown in the cross-section of FIG. 13; conductive regions 85 are formed from the same second metal layer as the wordline WL, as visible from FIG. 15, and are in electrical contact with the second-level, intermediate plugs 84 to allow electrical connections between the latter and bit-lines BL.

The wordlines WL and the conductive regions 85 are insulated from each other by a second nitride layer 86 and a fifth dielectric layer 87 (FIGS. 14 and 15).

A third nitride layer 88 and a sixth dielectric layer 89 are formed on the fifth dielectric layer 87, the wordlines WL and the conductive regions 85; the bit lines BL of conductive material are formed in the sixth dielectric layer 89 from a third metal layer; vias 90 connect the bitlines BL to the conductive regions 85.

Figure 16:
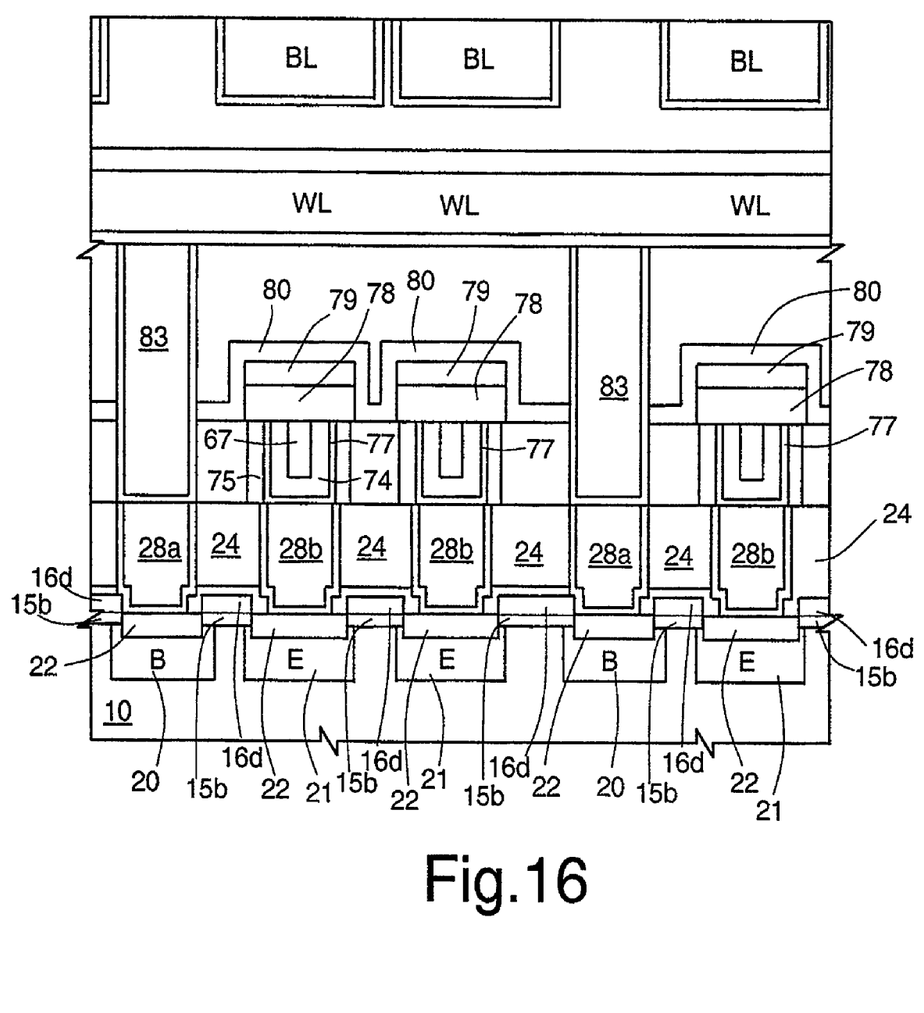
FIG. 16 shows a cross-section similar to FIG. 13, according to a different embodiment of the present memory device.

FIG. 16 shows a different embodiment, wherein a base contact region 20 is shared by two adjacent bipolar transistors.

The advantages of the present disclosure are clear from the above description. In particular, by forming the multilayer spacers 25 using at least two different layers (oxide layer 15 and nitride layer 16) while the silicide protection mask 16d is formed by a single layer (here nitride layer 16) it is possible to decouple the thickness of the silicon protection mask 16d in the array portion 1c from the length of the multilayer spacers 25 in the HV circuitry portion 1b. Therefore, these two parameters (thickness of the silicon protection mask 16d and length of the multilayer spacers 25) can be selected independently from each other, and in particular they can be optimized according the specific requirements.

The process involves a minimum modification of the standard CMOS flow; therefore the present process comprises standard steps, well known and reliable, whose sequence is also perfectly controlled.

Furthermore, the process allows the formation of two types of spacers in the circuitry area, if needed.

Figure 17:
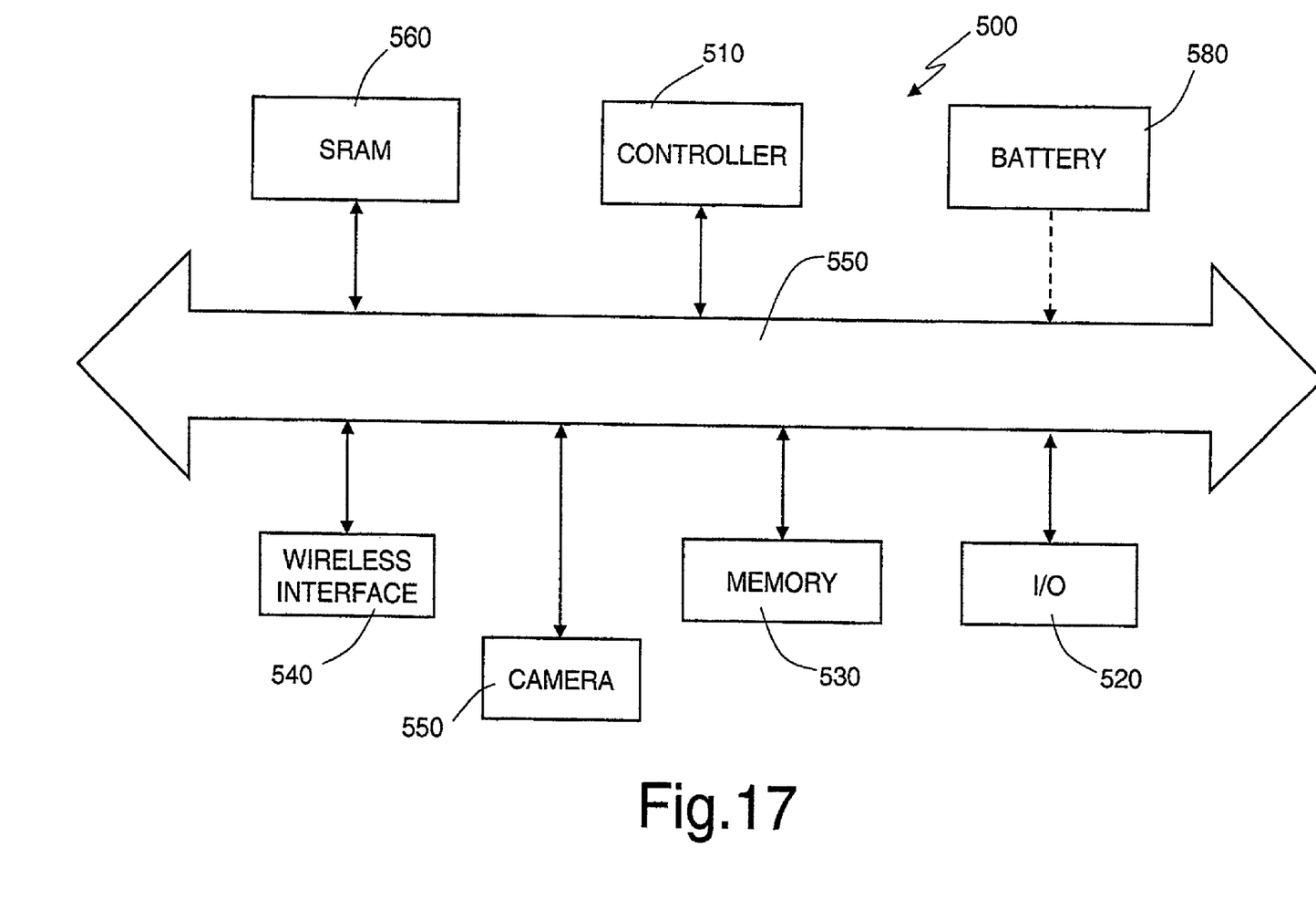
FIG. 17 is a system depiction for another embodiment.

Turning to FIG. 17, a portion of a system 500 in accordance with an embodiment of the present disclosure is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 includes a controller 510, an input/output (I/O) device 520 (e.g., a keypad, display), static random access memory (SRAM) 560, a memory 530, and a wireless interface 540 coupled to each other via a bus 550. A battery 580 is used in some embodiments. It should be noted that the scope of the present invention is not limited to embodiments having any or all of these components.

Controller 510 comprises, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory, in addition to a memory device as discussed herein.

I/O device 520 may be used by a user to generate a message. System 500 uses wireless interface 540 to transmit and receive messages to and from a wireless communication network with a radio frequency (RF) signal. Examples of wireless interface 540 may include an antenna or a wireless transceiver, although the scope of the present invention is not limited in this respect.

Finally, it is clear that numerous variations and modifications may be made to the contact region, the phase change memory cell and process described and illustrated herein, all falling within the scope of the present disclosure. In particular, it is underlined that the same flow may be used for forming any type of memory devices requiring a selector to access to the memory element, and also for forming MOS transistors outside the memory array, in both digital and analogical devices. Moreover, the bipolar transistor forming the selection elements may be also of the dual type, that is of NPN type.

In addition, the succession of the emitter regions and the base contact regions may vary; for example, the layouts shown in EP-A-1 408 550 may be selected.

Moreover, the multilayer spacers 25 may be used every time it is necessary to form spacers whose length is to be decoupled from the thickness of the silicon protection mask of bipolar transistors formed in an array area and operating as selection bipolar transistors of a memory array.

The materials of the second dielectric layer 15, first dielectric layer 16, lower oxide layer 11 may vary from the indicated ones, for example the second dielectric layer 15, the first dielectric layer 16 and the lower oxide layer 11 may be made of any dielectric material able to ensure the desired insulation.

Furthermore, the described process is usable also for other types of phase change memory cells, for example, for memory cells having the chalcogenic material enclosed in a pore of second dielectric layer 76.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheetare incorporated herein by reference, in their entirety. Aspects of the embodiments can be modified, if necessary to employ concepts of the various patents, applications and publications to provide yet further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process, comprising:
   manufacturing a memory device having a vertical bipolar transistor and a CMOS transistor in a semiconductor body having a surface, the manufacturing including:
   forming field insulation regions of dielectric material in said semiconductor body, the field insulating regions delimiting an array portion and a first circuitry portion, insulated from each other;
   forming the bipolar transistor in said array portion, including forming a buried first conduction region buried at a distance from said surface, forming a control region on said first conduction region, forming a second conduction region within said control region, and forming a control contact region within said control region and spaced apart from said second conduction region; and
   forming a first MOS transistor in said circuitry portion, including forming a first gate structure on said surface, forming first lightly doped regions in said body, laterally to said first gate structure, forming first lateral spacers on sides of said first gate structure, forming third conduction regions in said body, laterally to said first lateral spacers; wherein:
   forming the first lateral spacers comprises, after forming the first gate structure and before forming the second conduction region and the control contact region, the steps of:
   forming lower spacer portions on the sides of said first gate structure and forming a dielectric portion on said array portion; and
   forming upper spacer portions on top of and on the sides of said lower spacer portions, said lower spacer portions and upper spacer portions defining a multilayer structure;
   forming the bipolar transistor includes forming a protection mask by etching said dielectric portion on said array portion after forming the upper and lower spacer portions;
   forming the second conduction region includes selectively implanting first conductivity-type dopants through a first opening in the protection mask after forming the upper and lower spacer portions; and
   forming the control contact region includes selectively implanting second conductivity-type doping agents through a second opening in the protection mask after forming the upper and lower spacer portions.

2. A process according to claim 1, wherein forming the lower spacer portions, the dielectric portion, and the upper spacer portions comprises:
   forming a multilayer including first and second dielectric layers extending on said first gate structure on said circuitry portion and on said control region on said array portion;
   selectively removing said second dielectric layer so as to form the upper spacer portions on the sides of said first gate structure in said circuitry portion and to completely remove said second dielectric layer from said array portion;
   removing said first dielectric layer from said circuitry portion so as to form said lower spacer portions on the sides of said first gate structure, under said upper spacer portions and to form said dielectric portion on said array portion.

3. A process according to claim 2, wherein said first dielectric layer has a thickness comprised between 10 nm and 140 nm and said second dielectric layer has a thickness comprised between 10 nm and 90 nm.

4. A process according to claim 2, wherein forming a multilayer further comprises forming a third dielectric layer under said first dielectric layer, said third dielectric layer having a thickness comprised between 5 nm and 25 nm.

5. A process according claim 4, wherein said first dielectric layer is of nitride, and said second and third dielectric layers are of oxide.

6. A process according to claim 2, wherein forming field insulation regions comprises forming an MOS insulation region insulating a second circuitry portion from the array portion and the first circuitry portion, the process further comprising forming a second MOS transistor in said second circuitry portion, including forming a second gate structure on said surface, forming second lightly doped regions in said body, laterally to said first gate structure, forming second lateral spacers on sides of said second gate structure, forming fourth conduction regions in said body, laterally to said second lateral spacers, wherein selectively removing said second dielectric layer comprises completely removing said second dielectric layer from said second circuitry portion.

7. A process according to claim 1, further comprising the steps of forming a phase change memory element above and in electrical contact with said second conduction region.

8. A process according to claim 1, wherein the step of forming field insulation regions comprises forming a plurality of array insulation regions of dielectric material delimiting a plurality of active areas, insulated from each other, in said array portion and forming a plurality of bipolar junction transistors in said active areas.

9. A process according to claim 1, further comprising forming silicide regions on said second conduction region, said control contact region, said gate structures and said third conduction regions.

10. A memory device comprising:
a semiconductor body having a surface;
field insulation regions of dielectric material in said body, said field insulation regions delimiting an array portion and a first circuitry portion;
a bipolar transistor in said array portion, including a first conduction region extending at a distance from said surface, a control region on said first conduction region, a second conduction region surrounded by said control region, and a control contact region surrounded by said control region and spaced apart from said second conduction region;
a first MOS transistor in said circuitry portion, including first gate structure on said surface, first lightly doped regions in said body, laterally to said first gate structure, first lateral spacers on sides of said first gate structure, third conduction regions in said body, laterally to said lateral spacers, said first lateral spacers comprising lower spacer portions on the sides of said first gate structure and upper spacer portions on and laterally to said lower spacer portions, said lower spacer portions and upper spacer portions forming multilayer spacers; and
a silicide protection mask extending on said array portion and having openings on said second conduction region and control contact region.

11. A memory device according to claim 10, further comprising silicide regions on said second conduction region, said control contact region, said first gate structure and said third and fourth conduction regions.

12. A memory device according to claim 10 wherein said lower spacer portions have a thickness comprised between 20 nm and 120 nm and said upper spacer portions have a thickness comprised between 10 nm and 80 nm.

13. A memory device according to claim 10, further comprising a dielectric layer extending on said first gate structure, under said lower spacer portions and under said silicide protection mask, said dielectric layer having preferably a thickness comprised 5 nm and 25 nm.

14. A memory device according claim 13 wherein said lower spacer portions are of nitride, said upper spacer portions and said dielectric layer are of oxide.

15. A memory device according to claim 10, further comprising a phase change memory element above and in electrical contact with said second conduction region.

16. A memory device according to claim 10, further comprising an MOS insulation region insulating a second circuitry portion from the array portion and the first circuitry portion, the second circuitry portion accommodating a second MOS transistor having second lateral spacers formed of the same material and having the same thickness as said lower spacer portions.

17. A process, comprising:
manufacturing a memory device having a vertical bipolar transistor and a first MOS transistor in a semiconductor body having a surface, the manufacturing including:
forming in the body an array portion and a first circuitry portion insulated from each other;
forming a buried first conduction region of the bipolar transistor, the first conduction region being buried at a distance form the surface of the body;
forming, on the first conduction region and in the array region, a control region of the bipolar transistor;
forming, on the surface of the body, a first gate structure of the first MOS transistor;
forming a dielectric multilayer including first and second dielectric layers extending on said first gate structure and on said control region;
forming upper spacer portions on sides of said first gate structure by selectively removing said second dielectric layer in said circuitry portion and completely removing said second dielectric layer from said control region;
after forming the upper spacer portions, forming lower spacer portions on the sides of said first gate structure, under said upper spacer portions, by selectively removing said first dielectric layer from said circuitry portion and leaving an array dielectric portion of said first dielectric layer on said control region;
forming a protection mask by selectively etching said array dielectric portion after forming the upper spacer portions;
forming a second conduction region of the bipolar transistor in the control region by implanting first conductivity-type dopants through a first opening in the protection mask after forming the upper spacer portions; and
forming a control contact region of the bipolar transistor in the control region by implanting second conductivity-type doping agents through a second opening in the protection mask after forming the upper spacer portions.

18. A process according to claim 17, wherein said first dielectric layer has a thickness comprised between 10 nm and 140 nm and said second dielectric layer has a thickness comprised between 10 nm and 90 nm.

19. A process according to claim 17, wherein forming the protection mask, forming the second conduction region, and forming the control contact region are performed after forming the lower spacer portions.

20. A process according to claim 17, further comprising:
forming an MOS insulation region insulating a second circuitry portion from the array portion and the first circuitry portion; and
forming a second MOS transistor in said second circuitry portion, including forming a second gate structure on said surface, and forming lateral spacers on sides of said second gate structure, wherein selectively removing said second dielectric layer comprises completely removing said second dielectric layer from said second circuitry portion.

* * * * *